(12) United States Patent
Aigner et al.

(10) Patent No.: US 6,542,054 B2
(45) Date of Patent: Apr. 1, 2003

(54) ACOUSTIC MIRROR AND METHOD FOR PRODUCING THE ACOUSTIC MIRROR

(75) Inventors: Robert Aigner, München (DE); Stephan Marksteiner, Neubiberg (DE); Hans-Jorg Timme, Ottobrunn (DE); Lüder Elbrecht, München (DE); Annette Sänger, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/113,353

(22) Filed: Apr. 1, 2002

(65) Prior Publication Data

US 2002/0154425 A1 Oct. 24, 2002

Related U.S. Application Data

(63) Continuation of application No. PCT/EP00/09521, filed on Sep. 28, 2000.

(30) Foreign Application Priority Data

Sep. 30, 1999 (DE) .......................... 199 47 081

(51) Int. Cl.⁷ .................. H03H 9/54; H03H 3/02; H03H 9/15
(52) U.S. Cl. ................. 333/187; 29/25.35; 310/335
(58) Field of Search ................ 333/186–192; 310/335; 29/25.35

(56) References Cited

U.S. PATENT DOCUMENTS

| | | | | |
|---|---|---|---|---|
| 5,373,268 A | * | 12/1994 | Dworsky et al. | ........... 333/187 |
| 5,821,833 A | | 10/1998 | Lakin | ........... 333/187 |
| 5,872,493 A | * | 2/1999 | Ella | ........... 333/191 |
| 5,873,154 A | * | 2/1999 | Ylilammi et al. | ........... 29/25.35 |
| 6,441,702 B1 | * | 8/2002 | Panasik | ........... 333/189 |

FOREIGN PATENT DOCUMENTS

EP 0 633 049 B1 1/1995

OTHER PUBLICATIONS

Hayashi, Y. et al.: "Nitride Masked Polishing (NMP) Technique for Surface Planarization of Interlayer–Dielectric Films", XP 000312264, International Conference on Solid State Devices and Materials, 1992, pp.533–535.
Lakin, K.M et al.: "Development of Miniature Filters for Wireless Applications,"XP 000536995, IEEE, May 16, 1995, pp. 883–886.
Olutade, B. L.: "Sensitivity Analysis of a Thin Film Bulk Accoustic Resonator Ladder Filter", XP–000849589, IEEE, May 28, 1997, May 28, 1997, pp. 737–742.
Dubois, M.–A. et al.: "Solidly Mounted Resonator Based on Aluminum Nitride Thin Film", XP–002154875, IEEE, Oct. 5, 1998, pp. 909–912.

* cited by examiner

*Primary Examiner*—Barbara Summons
(74) *Attorney, Agent, or Firm*—Laurence A. Greenberg; Werner H. Stemer; Ralph E. Locher

(57) ABSTRACT

An acoustic mirror is described which is formed of at least one first insulating layer, a first metal layer disposed thereon, a second insulating layer disposed thereon and a second metal layer disposed thereon. An auxiliary layer is produced on the first insulating layer whereby a recess extending as far as the first insulating layer is created therein. The first metal layer is substantially deposited and removed by chemical/mechanical polishing until the parts of the first metal layer disposed outside the recess are no longer present. The second metal layer is also produced in a recess with the aid of chemical/mechanical polishing. More than two insulating layers and two metal layers can be provided. The first metal layer and the second metal layer can be produced in the same recess.

20 Claims, 2 Drawing Sheets

ACOUSTIC MIRROR AND METHOD FOR PRODUCING THE ACOUSTIC MIRROR

CROSS-REFERENCE TO RELATED APPLICATION

This application is a continuation of copending International Application No. PCT/EP00/09521, filed Sep. 28, 2000, which designated the United States.

BACKGROUND OF THE INVENTION

FIELD OF THE INVENTION

The invention relates to an acoustic mirror that reflects acoustic waves within a defined frequency range.

An acoustic mirror of this type is described, for example, in the reference by B. Olutade et al., titled "Sensitivity Analysis of Thin Film Bulk Acoustic Resonator Ladder Filter", IEEE International Frequency Control Symposium 1997, 737. The acoustic mirror contains a stack of thin films with alternately high and low acoustic impedances. The thickness of the thin films is, for example, a quarter of the wavelength of the acoustic waves that are to be reflected in the respective thin film. It is preferable for the production of the acoustic mirror to be as compatible as possible with silicon process techniques, so that the acoustic mirror can be integrated with other components on a chip.

It is known from the reference by Y. Hayashi et al., titled "Nitride Masked Polishing (NMP) Technique for Surface Planarization of Interlayer-Dielectric Films", Ext. Abstr. of the 1992 Int. Conf. on Solid State Devices and Materials, Tsukuba (1992), 533, that in order to produce a surface which is as planar as possible for a layer of borophosphosilicate glass (BPSG), which covers an elevated cell array and a periphery of a memory cell configuration, to apply a stop layer of silicone nitride to a part of the BPSG layer above the periphery and then to planarize the layer by chemical mechanical methods. Prior to the planarization, part of the BPSG layer above the cell array is elevated. On account of the stop layer, the part is removed selectively with respect to the part of the BPSG layer that lies above the periphery during planarization.

SUMMARY OF THE INVENTION

It is accordingly an object of the invention to provide an acoustic mirror and a method for producing the acoustic mirror which overcome the above-mentioned disadvantages of the prior art devices and methods of this general type, whose production is compatible with silicon process techniques and which can have a particularly high reflectivity compared to the prior art.

With the foregoing and other objects in view there is provided, in accordance with the invention, an acoustic mirror. The acoustic mirror contains a substrate, and a layered sequence formed of at least two insulating layers and at least two metal layers disposed alternately on top of one another on the substrate. The insulating layers have substantially equal thicknesses and the metal layers have substantially equal thicknesses. The thicknesses of the insulating layers and of the metal layers are such that a reflection condition is satisfied. An auxiliary layer having at least one recess formed therein, is provided, and at least the metal layers are disposed inside the at least one recess.

The greater the difference between the acoustic impedances of the layers of the acoustic mirror, the higher the reflectivity becomes. Metal layers have a particularly high impedance. The reflectivity of the acoustic mirror can be particularly high on account of the use of metal layers.

Acoustic waves are reflected by a stack that contains the insulating layers and the metal layers. The reflection condition which is satisfied by the thicknesses of the layers consists, for example, in the fact that an acoustic wave which has a defined frequency and impinges on the substrate at a defined angle is reflected particularly well by the layers.

The thicknesses of the insulating layers and of the metal layers are preferably in each case substantially $\lambda/4$, where $\lambda$ is the wavelength of an acoustic wave in the respective layer which is reflected particularly well if it impinges on the substrate at right angles. Given the same frequency of the wave, the wavelength is dependent on the impedance and on the specific density of the material passing the wave.

The insulating layers have a low acoustic impedance, while the metal layers have a high acoustic impedance. The thicknesses of the metal layers are therefore preferably identical. The same applies to the insulating layers. However, the insulating layers and the metal layers are generally of different thicknesses.

The lowermost layer in the stack is, for example, one of the insulating layers.

The uppermost layer in the stack is preferably one of the metal layers.

The layers of the stack are applied substantially conformally.

Adjacent layers of the stack preferably bear against one another. However, it is also possible for interlayers, for example diffusion barriers, which are very thin in relation to the other layers, to be disposed between the adjacent layers.

Since the metal layers are produced in at least one recess, the metal layers have smaller horizontal areas than the substrate. The capacitance of the acoustic mirror, which is formed by the metal layers, is smaller than an acoustic mirror in which the metal layers cover the entire substrate.

A metal layer that covers the entire substrate, on account of a high layer stress, causes bending of the substrate, which increases as the thickness of the metal layer rises. In the acoustic mirror according to the invention, bending of the substrate is avoided, since the metal layers do not cover the entire substrate, but rather are only disposed in one or more recesses.

The metal layers are in each case initially deposited over the entire surface and then structured by chemical mechanical polishing in such a way that they are disposed inside the respectively associated recess. The metal can be structured more effectively by chemical mechanical polishing than by etching with the aid of a photolithography process. The reason for this is the bending of the substrate after deposition of the metal layer over the entire surface, which leads to problems with photolithographic processes. By way of example, in the event of substantial bending it is impossible to find alignment marks in order to align masks. Furthermore, in the event of bending of the substrate, sharp focusing during exposure to produce the masks from photoresist is no longer possible. In the method according to the invention, the recess can be produced with the aid of a photolithographic method prior to deposition of the metal layer, i.e. with an unbent substrate. The shape of the recess defines the shape of the metal layer.

The method allows the simultaneous production of contacts or lines, which are likewise produced on the substrate, by corresponding structuring of the auxiliary layer and by filling the recesses or contact holes produced by the deposition and the chemical mechanical polishing of the metal layer. In this case too, the required lithography takes place with an unbent substrate.

As a result of the provision of an auxiliary layer which surrounds the metal layer, the difference in height between a region in which the metal layer is disposed and a region that is disposed next to the metal layer is nonexistent or lower than if the metal layer had been structured by etching. In a method according to the invention, therefore, no topology problems are encountered. In contrast, when metal is etched with the aid of a photolithography method to produce the metal layer without the use of the auxiliary layer and of the recess, a step is formed, which causes problems during the deposition of further layers or during photolithographic methods, in which both a region of the structured metal layer and an adjoining region are exposed. Considerable differences in height cause problems in particular for photolithography process steps, since even when the photoresist is being applied by centrifuging it is impossible to produce a homogeneous layer without fluctuations in thickness. Photolithographic steps of this type are required, for example, if electrodes, for example, are to be applied to the acoustic mirror.

One of the metal layers may be disposed in a recess in which there is otherwise no further metal layer. In this case, after the recess has been produced, the metal layer is deposited and is planarized by chemical mechanical methods. If a further metal layer is to be produced above the metal layer, one of the insulating layers is produced on the auxiliary layer, followed by a further auxiliary layer with a recess which is disposed above the recess in the auxiliary layer and passes all the way through the further auxiliary layer. The further metal layer is produced in the recess in the further auxiliary layer.

No further metal layer and none of the insulating layers are disposed inside the recess. Since the metal layer is structured by chemical mechanical polishing, the depth of the recess is greater than or equal to the thickness of the structured metal layer. It is preferable for the metal layer to substantially fill the recess.

However, an upper surface of the metal layer may also lie at a lower level than an upper surface of the auxiliary layer. In this case, the metal layer and a part of the insulating layer disposed above it substantially fill the recess. Since the insulating layer is disposed on the auxiliary layer and the metal layer, in this case too the insulating layer is not disposed inside the recess. Only part of the insulating layer is disposed inside the recess.

It is possible, for example, for all the metal layers to be produced in each case in a dedicated recess. The recesses are disposed on top of one another. One of the insulating layers is disposed between in each case two of the auxiliary layers.

To reduce the process outlay, it is advantageous if at least two of the metal layers and one of the insulating layers disposed there-between are produced in the same recess. For this purpose, after the recess has been produced, one metal layer is deposited over the entire surface, followed by the insulating layer and then the further metal layer. Then, the metal layers and the insulating layer are abraded by chemical mechanical polishing in one step until parts of the two metal layers and of the insulating layer which are disposed outside the recess have been removed.

The lowermost layer of the layers that are produced in the recess may be another of the insulating layers or one of the two metal layers.

To increase the reflectivity of the acoustic mirror, it is also possible for more than two metal layers to be produced in the same recess. For this purpose, the auxiliary layer has to be formed with an even greater thickness and further insulating layers and metal layers have to be deposited.

The depth of the recess is greater than or equal to the sum of the thicknesses of all the layers disposed inside the recess.

By way of example, a horizontal area of the metal layers is between $(20*20)$ $\mu m^2$ and $(400*400)$ $\mu m^2$. With areas of this size, a chemical mechanical polishing effect known as dishing may occur. In this event, during the thinning of large regions, central parts are abraded to a greater extent than outer parts. To prevent dishing, it is advantageous if a stop layer is applied to the metal layer that would be uncovered during the chemical mechanical polishing. The thickness of the stop layer is preferably between 30 nm and 100 nm or is at least five times smaller than the thickness of the metal layer. The stop layer is formed of a material that is scarcely attacked during the chemical mechanical polishing of the metal. Parts of the stop layer that are disposed outside the recess are removed. Then, the metal layer undergoes chemical mechanical polishing selectively with respect to the stop layer. In the process, the stop layer prevents dishing from also abrading parts of the metal layer that lie inside the recess. The depth of the recess should be not less than the sum of all the layers disposed therein, including the stop layer.

If a plurality of metal layers are produced in the same recess, the stop layer covers the uppermost metal layer.

The stop layer is formed, for example, of titanium, TiN or silicon nitride.

The stop layer can, for example, be structured by chemical mechanical polishing. Alternatively, the stop layer is structured by a photolithography method. A suitable method in this case is, for example, dry etching.

After structuring the metal layers, the stop layers disposed thereon can be removed.

The metal layers contain, for example, of tungsten. Alternatively, the metal layers may be formed of molybdenum or platinum.

The insulating layers contain, for example, of $SiO_2$ or of silicon nitride.

The auxiliary layers contain, for example, of $SiO_2$ or of silicon nitride.

To ensure that the recesses are of a defined depth, the auxiliary layers may be selectively etchable with respect to the insulating layers. To produce the recesses, the auxiliary layers are etched selectively with respect to the insulating layers.

Alternatively, an etching stop layer that can be etched selectively with respect to the auxiliary layer is produced between the auxiliary layer and the insulating layer disposed below it. To produce the recess, the auxiliary layer is etched selectively with respect to the etching stop layer until a part of the etching stop layer has been uncovered.

The part of the etching stop layer can then be removed or acts as part of the insulating layer.

It is preferable for there to be two or three metal layers.

With the foregoing and other objects in view there is provided, in accordance with the invention, a method for producing an acoustic mirror. The method includes the steps of providing a substrate, providing a first insulating layer on the substrate, providing a first auxiliary layer on the first insulating layer, forming a first recess in the first auxiliary layer, depositing a first metal layer over the first auxiliary layer and the first recess, abrading by chemical mechanical polishing the first metal layer until parts of the first metal layer disposed outside the first recess have been removed, and providing a second insulating layer over the first metal layer in the first recess and the first auxiliary layer. The second insulating layer has a thickness substantially equivalent to a thickness of the first insulating layer. A second auxiliary layer is provided on the second insulating layer. A second recess is formed in the second auxiliary layer. A second metal layer is deposited over the second insulting layer and in the second recess. The second metal layer has a thickness substantially equivalent to a thickness of the first metal layer. The thickness of the first and second metal layers and the first and second insulating layers are such that a reflection condition is satisfied. The second metal layer is abraded by chemical mechanical polishing until parts of the second metal layer disposed outside the second recess have been removed.

Other features which are considered as characteristic for the invention are set forth in the appended claims.

Although the invention is illustrated and described herein as embodied in an acoustic mirror and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

The figures are not to scale.

DESCRIPTION OF THE PREFERRED EMBODIMENTS

Figure 1:
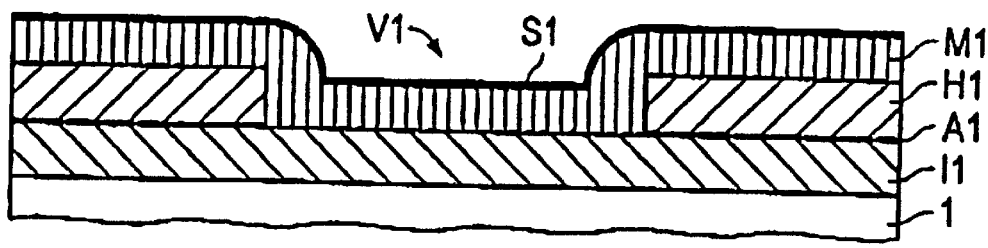
FIG. 1 is a diagrammatic, cross-sectional view through a first substrate after a first insulating layer, a first etching stop layer, a first auxiliary layer, a first recess, a first metal layer and a first stop layer have been produced according to the invention.

Referring now to the figures of the drawing in detail and first, particularly, to FIG. 1 thereof, there is shown in a first exemplary embodiment having a first substrate 1 made from silicon and is provided as a starting material.

An approximately 0.8 $\mu$m thick first insulating layer I1 containing $SiO_2$ is produced on the first substrate 1.

An approximately 100 nm thick first etching stop layer A1 containing silicon nitride is produced on the first insulating layer I1. Above this, an approximately 0.9 $\mu$m thick first auxiliary layer H1 containing $SiO_2$ is produced.

With the aid of a first non-illustrated photoresist mask, a first recess V1 is produced in the first auxiliary layer H1, by initially etching $SiO_2$ selectively with respect to silicon nitride until a part of the etching stop layer A1 is uncovered, and then removing the part of the etching stop layer A1 selectively with respect to $SiO_2$. The first recess V1 passes all the way through the first auxiliary layer H1 and the etching stop layer A1. The first recess V1 has a square horizontal cross section with a side length of approximately 200 $\mu$m. The first recess V1 extends as far as the first insulating layer I1.

To produce a first metal layer M1, tungsten is deposited to a thickness of approximately 0.7 $\mu$m. Above this, an approximately 50 nm thick first stop layer S1 containing titanium is produced.

Figure 2:
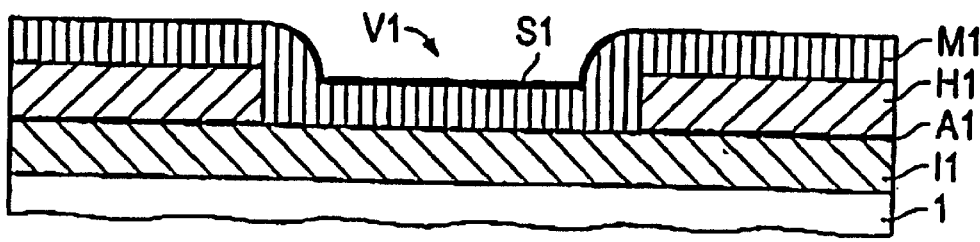
FIG. 2 is a cross-sectional view similar to FIG. 1 after the stop layer has been structured.

Parts of the first stop layer S1 which are disposed outside the first recess V1 are removed by chemical mechanical polishing of the first stop layer S1 selectively with respect to the first metal layer M1 (see FIG. 2).

Figure 3:
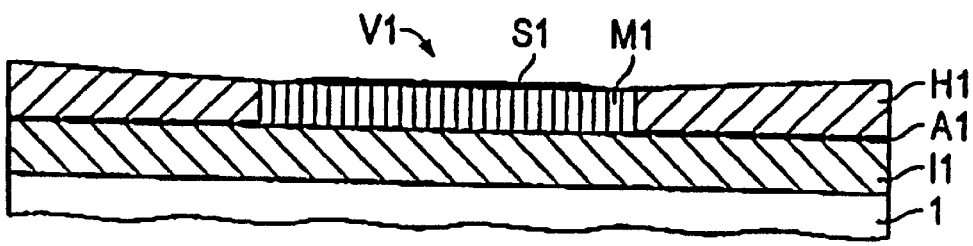
FIG. 3 is a cross-sectional view similar to FIG. 2 after the first metal layer has been structured.

Then, the first metal layer M1 is abraded selectively with respect to the first auxiliary layer H1 and with respect to the stop layer S1 by chemical mechanical polishing, until parts of the first metal layer M1 which are disposed outside the first recess V1 have been removed (see FIG. 3). The structured first metal layer M1 and the structured first stop layer S1 are disposed inside the first recess V1.

Figure 4:
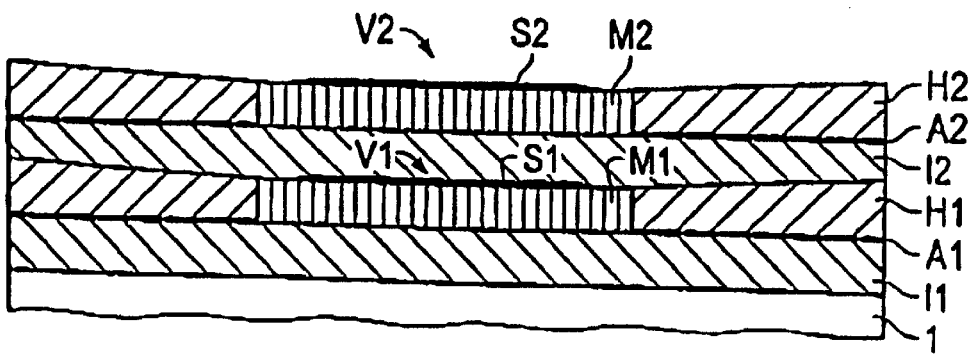
FIG. 4 is a cross-sectional view similar to FIG. 3 after a second insulating layer, a second etching stop layer, a second auxiliary layer, a second recess, a second metal layer and a second stop layer have been produced and structured.

An approximately 1.6 $\mu$m thick second insulating layer I2 containing $SiO_2$ is produced on the first auxiliary layer H1 and the first metal layer M1 that is covered by the first stop layer S1 (see FIG. 4).

Above this, an approximately 100 nm thick second etching stop layer A2 containing silicon nitride is produced. Above this, a 0.9 $\mu$m thick second auxiliary layer H2 containing $SiO_2$ is produced, in which a second recess V2 is produced in the same way as in the first auxiliary layer H1. The second recess V2 is configured in the same way as the first recess V1 and is disposed directly above the first recess V1.

Then, an approximately 0.7 $\mu$m thick second metal layer M2 containing tungsten is produced and, above this, an approximately 50 nm thick second stop layer S2 containing titanium is produced (see FIG. 4). The second stop layer S2 and the second metal layer M2 are structured by chemical mechanical polishing in the same way as the first stop layer S1 and the first metal layer M1 (see FIG. 4).

The method described produces an acoustic mirror which, on account of the first insulating layer I1, the first metal layer M1, the second insulating layer I2 and the second metal layer M2, allows acoustic waves at a frequency of approximately 1.8 GHz to be reflected particularly successfully when they impinge on the substrate 1 at right angles.

Figure 5:
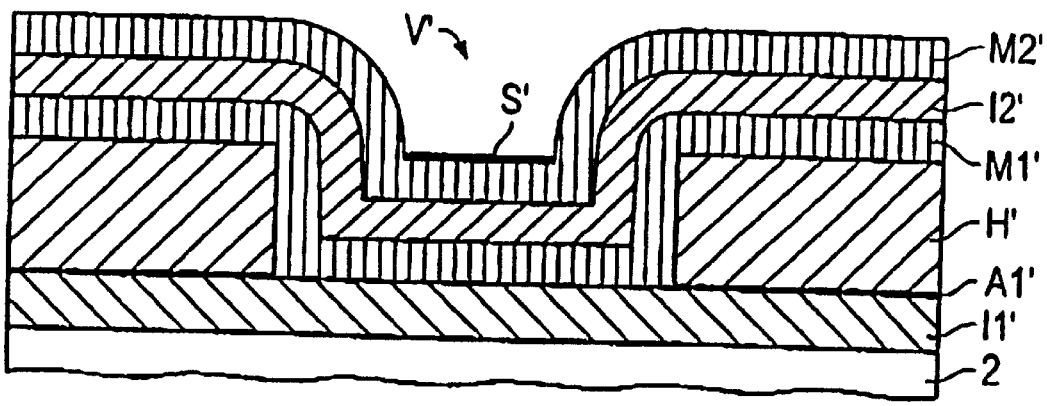
FIG. 5 is a cross-sectional view through a second substrate after a first insulating layer, a first etching stop layer, an auxiliary layer, a recess, a first metal layer, a second insulating layer, a second metal layer and a stop layer have been produced.

In a second exemplary embodiment, a second substrate 2 made from silicon is provided as the starting material (see FIG. 5).

An approximately 0.8 $\mu$m thick first insulating layer I1' containing $Sio_2$ is produced on the second substrate 2.

An approximately 100 nm thick first etching stop layer A1' containing silicon nitride is produced on the first insulating layer I1'. Above this, an approximately 2.7 $\mu$m thick first auxiliary layer H' containing $SiO_2$ is produced (see FIG. 5).

The first auxiliary layer H' is structured with the aid of a non-illustrated photoresist mask. In this case, $SiO_2$ is etched selectively with respect to the silicon nitride, until part of the first etching stop layer A1' has been uncovered. Then, the part of the etching stop layer A1' is removed. In this way, a first recess V' is produced in the first auxiliary layer H', which first recess V' extends as far as the first insulating layer I1' and has a horizontal cross section which is square and has a side length of approximately 200 μm.

Then, an approximately 0.7 μm thick first metal layer M1' containing tungsten is produced. Above this, an approx. 0.8 μm thick second insulating layer I2' containing $Sio_2$ is produced. Above this, an approximately 0.7 μm thick second metal layer M2' containing tungsten is produced (see FIG. 5).

An approximately 50 nm thick first stop layer S' containing titanium is produced on the second metal layer M2'.

With the aid of a non-illustrated second photoresist mask, the first stop layer S' is structured in such a way that parts of the first stop layer S' which are disposed outside the first recess V' are removed (see FIG. 5).

Figure 6:
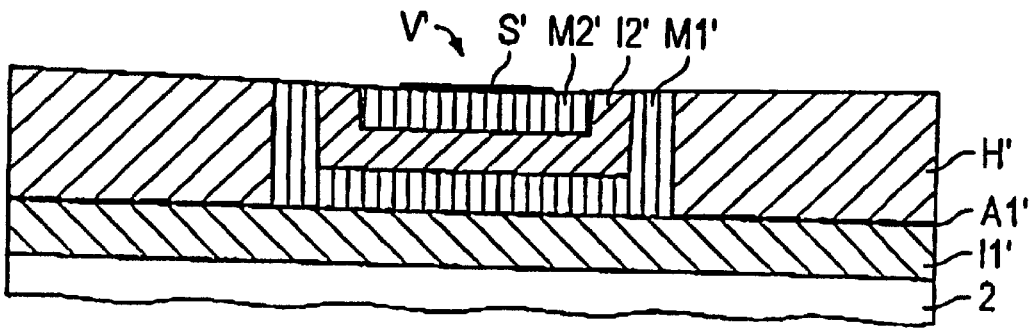
FIG. 6 is a cross-sectional view similar to FIG. 5 after the first metal layer, the second insulating layer and the second metal layer have been structured.

Then, the second metal layer M2', the second insulating layer I2' and the first metal layer M1' are abraded selectively with respect to the first stop layer S' and with respect to the first auxiliary layer H' by chemical mechanical polishing until parts of the second metal layer M2', of the second insulating layer I2' and of the first metal layer M1' which are disposed outside the first recess V' have been removed (see FIG. 6).

Then, an approximately 0.8 μm thick third insulating layer I3' containing $SiO_2$ is produced. An approximately 100 nm thick second etching stop layer A2' containing silicon nitride is produced on the third insulating layer I3'. Above this, an approximately 0.9 μm thick second auxiliary layer H" containing $SiO_2$ is produced. The second auxiliary layer H" is structured with the aid of a non-illustrated third photoresist mask. In the process, a second recess V1", that extends as far as the third insulating layer I3', is produced in the second auxiliary layer H".

Figure 7:
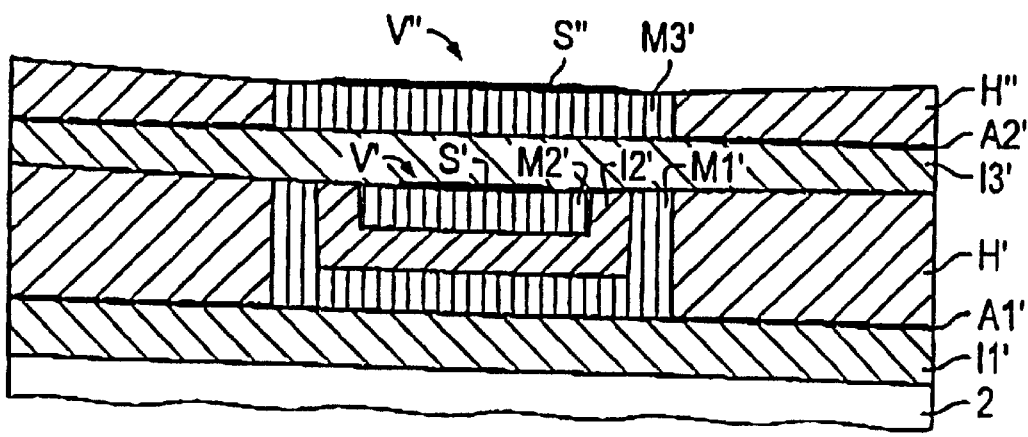
FIG. 7 is a cross-sectional view similar to FIG. 6 after a further insulating layer, a second etching stop layer, a further auxiliary layer, a further recess, a further metal layer and a further stop layer have been produced.

Then, an approximately 0.7 μm thick third metal layer M3' containing tungsten is produced. An approximately 50 nm thick second stop layer S" containing titanium is produced on the third metal layer M3' (see FIG. 7). With the aid of a non-illustrated fourth photoresist mask, the second stop layer S" is structured in such a way that parts of the second stop layer S" which are disposed outside the second recess V1" are removed. Then, the third metal layer M3' is abraded selectively with respect to the second stop layer S" and with respect to the second auxiliary layer H" by chemical mechanical polishing, until parts of the second metal layer M3' which are disposed outside the second recess V" have been removed (see FIG. 7).

This method produces an acoustic mirror in which acoustic waves are reflected by the first insulating layer I1', the first metal layer M1', the second insulating layer I2', the second metal layer M2', the third insulating layer I3' and the third metal layer M3'.

The first metal layer M1' covers flanks and a base of the first recess. V' without filling the first recess V'.

Numerous variations of the exemplary embodiments are conceivable and likewise lie within the scope of the invention. By way of example, the dimensions of the layers and recesses described can be adapted to the particular requirements. To reflect acoustic waves with longer or shorter wavelengths, the thicknesses of the first insulating layer, of the second insulating layer, of the first metal layer and of the second metal layer are selected to be greater or smaller. To improve the reflectivity, it is possible to produce more than two or three insulating layers and two or three metal layers. The stop layers can be removed after the chemical mechanical polishing. It is also possible for other materials to be selected for the metal layers, the auxiliary layers, the stop layers, the etching stop layers and the insulating layers.

We claim:

1. An acoustic mirror, comprising:
    a substrate;
    a layered sequence formed of at least two insulating layers and at least two metal layers disposed alternately on top of one another on said substrate, said at least two insulating layers having substantially equal thicknesses and said at least two metal layers having substantially equal thicknesses, said thicknesses of said insulating layers and of said metal layers being such that a reflection condition is satisfied; and
    an auxiliary layer having at least one recess formed therein, and at least one of said at least two metal layers disposed inside said at least one recess.

2. The acoustic mirror according to claim 1, wherein:
    said auxiliary layer contains two auxiliary sublayers having recesses formed therein, said two auxiliary sublayers include a first auxiliary layer having a first recess formed therein and a second auxiliary layer having a second recess formed therein;
    said first recess and said second recess are aligned on top of one another;
    one of said at least two insulating layers disposed between said two auxiliary sublayers;
    a first of said at least two metal layers disposed inside said first recess in said first auxiliary layer within which there is otherwise no further metal layer;
    said first recess passes completely through said first auxiliary layer;
    said first auxiliary layer disposed on another one of said at least two insulating layers; and
    a second of said at least two metal layers disposed inside said second recess in said second auxiliary layer.

3. The acoustic mirror according to claim 2, further comprising a stop layer disposed on said first of said at least two metal layers inside said first recess, and said first recess has a depth that is not less than a sum of a thickness of all layers disposed in said first recess.

4. The acoustic mirror according to claim 1, wherein:
    two of said at least two metal layers and one of said at least two insulating layers disposed there-between are disposed inside one of said at least one recess; and
    a lowermost of said two metal layers and said one of said insulating layers disposed inside said one recess substantially covers a base and flanks of said one recess, so that a central region of said lowermost metal layer is lowered.

5. The acoustic mirror according to claim 1, further comprising an etching stop layer disposed between at least one of said insulating layers and said auxiliary layer disposed thereon.

6. The acoustic mirror according to claim 1, wherein:
    said at least two metal layers contain tungsten; and
    said at least two insulating layers contain a material selected from the group consisting of $SiO_2$ and silicon nitride.

7. A method for producing an acoustic mirror, which comprises the steps of:

providing a substrate;
providing a first insulating layer on the substrate;
providing a first auxiliary layer on the first insulating layer;
forming a first recess in the first auxiliary layer;
depositing a first metal layer over the first auxiliary layer and the first recess;
abrading by chemical mechanical polishing the first metal layer until parts of the first metal layer disposed outside the first recess have been removed;
providing a second insulating layer over the first metal layer in the first recess and the first auxiliary layer, the second insulating layer having a thickness substantially equivalent to a thickness of the first insulating layer;
providing a second auxiliary layer on the second insulating layer;
forming a second recess in the second auxiliary layer;
depositing a second metal layer over the second insulting layer and in the second recess, the second metal layer having a thickness substantially equivalent to a thickness of the first metal layer, the thickness of the first and second metal layers and the first and second insulating layers being such that a reflection condition is satisfied; and
abrading by chemical mechanical polishing the second metal layer until parts of the second metal layer disposed outside the second recess have been removed.

8. The method according to claim 7, which comprises:
aligning the first recess and the second recess on top of each other; and
forming the first recess to pass completely through the first auxiliary layer.

9. The method according to claim 8, which comprises forming the second recess to extend as far as the second insulating layer.

10. The method according to claim 7, which comprises:
applying a stop layer on the first metal layer after the depositing of the first metal layer and prior to the abrading of the first metal layer;
forming the first recess to have a given depth not less than a sum of the thickness of the first metal layer and a thickness of the stop layer;
removing parts of the stop layer disposed outside the first recess; and
abrading the first metal layer selectively with respect to the stop layer by chemical mechanical polishing.

11. The method according to claim 7, which comprises producing an etching stop layer between at least one of the first insulating layer and the first auxiliary layer and the second insulating layer and the second auxiliary layer.

12. The method according to claim 7, which comprises:
producing the first metal layer and the second metal layer from tungsten; and
producing the first insulating layer and the second insulating layer from a material selected from the group consisting of SiO$_2$ and silicon nitride.

13. A method for producing an acoustic mirror, which comprises the steps of:
providing a substrate;
providing a first insulating layer on the substrate;
providing a first auxiliary layer on the first insulating layer;
forming a recess in the first auxiliary layer;

depositing a first metal layer over the first auxiliary layer and the recess;
providing a second insulating layer over the first metal layer, the second insulating layer having a thickness substantially equivalent to a thickness of the first insulating layer;
depositing a second metal layer over the second insulting layer, the second metal layer having a thickness substantially equivalent to a thickness of the first metal layer, the thickness of the first and second metal layers and the first and second insulating layers being such that a reflection condition is satisfied; and
abrading by chemical mechanical polishing the second metal layer, the second insulation layer and the first metal layer until parts of the second metal layer, the second insulation layer and the first metal layer disposed outside the recess have been removed.

14. An acoustic mirror, comprising:
a substrate;
a first insulating layer disposed on said substrate;
a first auxiliary layer disposed above said first insulating layer, said first auxiliary layer having a first recess formed therein;
a first metal layer disposed on said first insulating layer within said first recess;
a second insulating layer disposed on said first metal layer, said first insulating layer and said second insulating layer each having substantially equivalent thicknesses;
a second auxiliary layer disposed above said second insulating layer and having a second recess formed therein; and
a second metal layer disposed on said second insulating layer within said second recess, said first metal layer and said second metal layer each having substantially equivalent thicknesses, and said thicknesses of said first insulating layer, said second insulating layer, said first metal layer and said second metal layer being such that a reflection condition is satisfied.

15. The acoustic mirror according to claim 14, wherein:
said first recess and said second recess are disposed on top of one another; and
said first recess passes completely through said first auxiliary layer, and said first auxiliary layer is disposed on said first insulating layer.

16. The acoustic mirror according to claim 15, further comprising a stop layer disposed on said first metal layer within said first recess, and said first recess having a depth that is not less than a sum of said thicknesses of said first metal layer and a given thickness of said stop layer.

17. The acoustic mirror according to claim 14, further comprising an etching stop layer disposed between one of said first insulating layer and said first auxiliary layer and said second insulating layer and said second auxiliary layer.

18. The acoustic mirror according to claim 14, wherein:
said first metal layer and said second metal layer contain tungsten; and
said first insulating layer and said second insulating layer contain a material selected from the group consisting of SiO$_2$ and silicon nitride.

19. An acoustic mirror, comprising:
a substrate;
a first insulating layer disposed on said substrate;
an auxiliary layer disposed above said first insulating layer, said first auxiliary layer having a recess formed therein;

a first metal layer disposed within said recess;

a second insulating layer disposed on said first metal layer, said first insulating layer and said second insulating layer having substantially equivalent thicknesses; and a second metal layer disposed on said second insulating layer within said recess, said first metal layer and said second metal layer each having substantially equivalent thicknesses, and said thicknesses of said first insulating layer, said second insulating layer, said first metal layer and said second metal layer being such that a reflection condition is satisfied.

20. The acoustic mirror according to claim 19, wherein said first metal layer, said second metal layer and said second insulating layer are disposed inside said recess, and said first metal layer substantially completely covers a base and flanks of said recess, so that a central region of said first metal layer is lowered.

* * * * *